(12) United States Patent
Kagaya et al.

(10) Patent No.: US 8,076,770 B2
(45) Date of Patent: Dec. 13, 2011

(54) SEMICONDUCTOR DEVICE INCLUDING A FIRST LAND ON THE WIRING SUBSTRATE AND A SECOND LAND ON THE SEALING PORTION

(75) Inventors: Yutaka Kagaya, Tokyo (JP); Fumitomo Watanabe, Tokyo (JP); Hajime Takasaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 352 days.

(21) Appl. No.: 12/190,010

(22) Filed: Aug. 12, 2008

(65) Prior Publication Data

US 2009/0045497 A1 Feb. 19, 2009

(30) Foreign Application Priority Data

Aug. 13, 2007 (JP) ................................. 2007-210673

(51) Int. Cl.
*H01L 23/48* (2006.01)
*H01L 21/56* (2006.01)

(52) U.S. Cl. .. 257/698; 257/690; 257/784; 257/E23.021

(58) Field of Classification Search .................. 257/686, 257/777, 690, 698, 784, E23.021
See application file for complete search history.

(56) References Cited

U.S. PATENT DOCUMENTS

| 6,740,964 | B2 * | 5/2004 | Sasaki ........................... 257/687 |
| 6,828,665 | B2 * | 12/2004 | Pu et al. ......................... 257/686 |
| 6,861,288 | B2 * | 3/2005 | Shim et al. .................... 438/109 |
| 7,456,495 | B2 | 11/2008 | Pohl et al. |
| 2004/0124539 | A1 * | 7/2004 | Yang et al. .................... 257/777 |
| 2007/0045796 | A1 | 3/2007 | Ye et al. |
| 2007/0241437 | A1 | 10/2007 | Kagaya et al. |
| 2009/0096097 | A1 * | 4/2009 | Kagaya et al. ................ 257/737 |

FOREIGN PATENT DOCUMENTS

| JP | 2004-56093 | 2/2004 |
| JP | 2004-327855 | 11/2004 |
| JP | 2006-303079 | 11/2006 |

* cited by examiner

*Primary Examiner* — Anh Mai
(74) *Attorney, Agent, or Firm* — Young & Thompson

(57) ABSTRACT

A semiconductor device includes a wiring board having connection pads thereon and a semiconductor chip mounted on the wiring board. The wiring board and the semiconductor chip are covered with a sealing portion. Conductive members are extended upward from the connection pads and are exposed from the sealing portion. Rewiring lines are connected to the exposed conductive members. Land portions are arranged on the sealing portion and are electrically connected to the conductive members through the rewiring lines.

9 Claims, 13 Drawing Sheets

SEMICONDUCTOR DEVICE INCLUDING A FIRST LAND ON THE WIRING SUBSTRATE AND A SECOND LAND ON THE SEALING PORTION

This application is based upon and claims the benefit of priority from Japanese patent application No. 2007-210673, filed on Aug. 13, 2007, the disclosure of which is incorporated herein in its entirety by reference.

BACKGROUND OF THE INVENTION

1. Field of the Invention

The present invention relates to a semiconductor device and a manufacturing method thereof.

2. Description of Related Art

Recent development in technology has brought practical application of stacking type semiconductor devices designed to be stacked one on another. For example, a related stacking semiconductor device employs a structure in which a semiconductor chip is sealed with resin or the like and external terminals used for stacking are provided in the outer periphery thereof.

A related stacking semiconductor device is typically composed of a wiring board for mounting a semiconductor chip, wires of Au or the like for electrically connecting between the wiring board and the semiconductor chip, resin for protecting the semiconductor chip from the outside, solder balls for external connection, and external terminals used for stacking. The external terminals used for stacking are arranged in the outer periphery of the sealing body made of resin or the like, which poses a restriction for the arrangement of the external terminals that the sealed region must be avoided.

The related stacking semiconductor device is typically manufactured by a method as described below.

Firstly, a semiconductor chip is mounted on a wiring board, and the wiring board and the semiconductor chip are connected to each other by means of wires of Au or the like. The semiconductor chip is sealed with resin while avoiding external terminals provided on the surface on which the semiconductor chip is mounted and required for stacking another semiconductor device. Finally, solder balls are mounted, and the board is cut to obtain a stacking semiconductor device.

A related stacking semiconductor device fabricated in this manner has a structure in which a semiconductor chip is fixed to the top of a wiring board, electrodes of the semiconductor chip and wiring lines on the top surface of the wiring board are connected to each other by means of wires, and the wiring board has electrodes on the lower surface thereof. The semiconductor chip and the wires on the top surface of the wiring board are covered with a sealing body made of an insulative resin. Connection lands for a semiconductor device to be stacked on top of this semiconductor device are provided on the top surface of the wiring board in the outside of the sealing body.

A related semiconductor device is described for example in Japanese Laid-Open Patent Publication No. 2006-303079.

In the related stacking semiconductor device, however, the connection lands for connection of a semiconductor device to be stacked on top thereof are provided in a region outside the sealing body of the wiring board. This poses restrictions on the arrangement and size of external terminals of the semiconductor device to be stacked on top. The restrictions posed on the external terminals include, for example, the need of arranging the external terminals in a fan-out pattern, and the need of designing the external terminals to be higher than the height of the sealing body. These restrictions impair the degree of freedom in designing the external terminals of the semiconductor device to be stacked on top.

The fan-out pattern arrangement of the external terminals in the semiconductor device stacked on top leads to increase of the area of the wiring board used for each semiconductor device, which may lead to increase in the manufacturing cost of the semiconductor device stacked on top.

Moreover, if the diameter of the external terminals of the semiconductor device stacked on top is increased in order to make the external terminals higher than the height of the sealing body, it will also increase the dimension in planar direction and will cause a problem of increased distance between the lands. If an intermediate member is used to add its height to the height of the external terminals, it will increase the manufacturing cost.

Other related semiconductor devices are described for example in Japanese Patent Publication No. 2004-327855 and No. 2004-56093.

SUMMARY

The present invention seeks to solve one or more of the above problems, or to improve upon those problems at least in part.

In one embodiment, there is provided a semiconductor device includes a wiring board having connection pads thereon and a semiconductor chip mounted on the wiring board. The wiring board and the semiconductor chip are covered with a sealing portion. Conductive members are extended upward from the connection pads and are exposed from the sealing portion. Rewiring lines are connected to the exposed conductive members. Land portions are arranged on the sealing portion and are electrically connected to the conductive members through the rewiring lines.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1A:
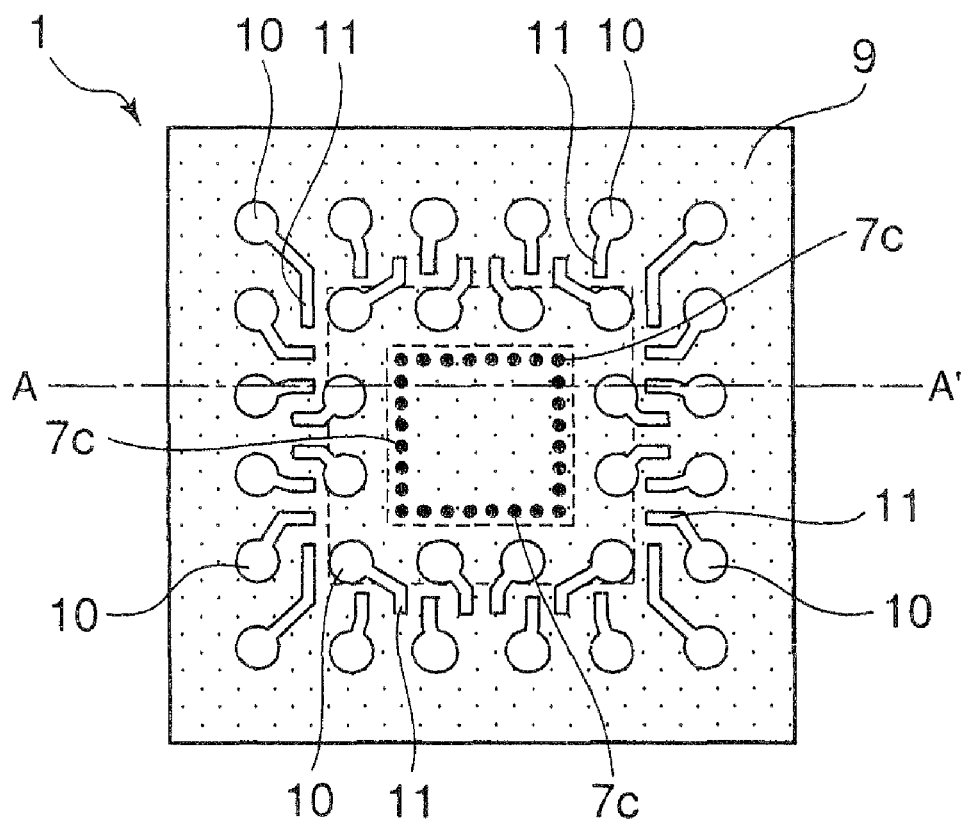
FIG. 1A is a plan view showing a semiconductor device according to a first embodiment of the present invention.
Figure 1B:
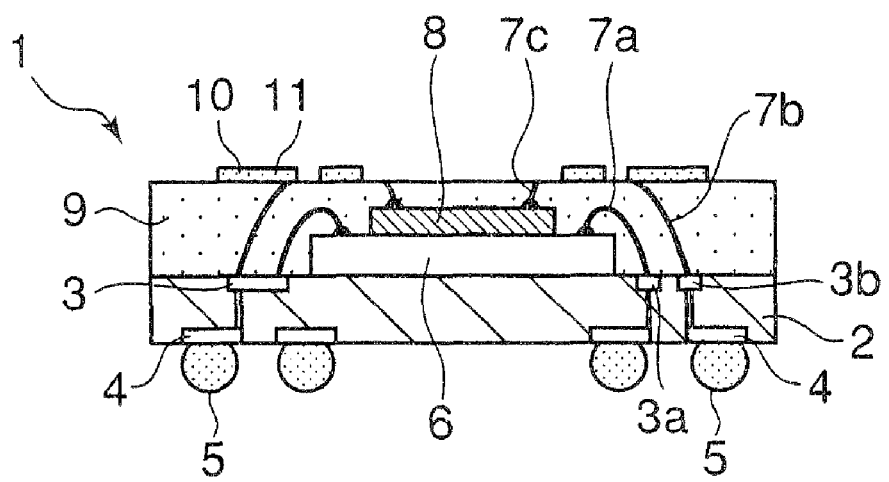
FIG. 1B is a cross-sectional view showing the semiconductor device according to the first embodiment of the present invention.

As shown in FIGS. 1A and 1B, the semiconductor device 1 of the first embodiment has a substantially square plate-shaped wiring board 2. The wiring board 2 is formed of a 0.25 mm thick glass epoxy board, for example, and predetermined wiring patterns are formed on first and second surfaces of the wiring board 2, respectively.

The wiring board 2 has a plurality of connection pads 3 arranged near the periphery on the first surface, and a plurality of first land portions 4 are arranged on the second surface of the wiring board 2. Each of the connection pads 3 is electrically connected to the first land portion 4 corresponding thereto by means of predetermined wiring. An insulating film (not shown) of a solder resist, for example, is formed on the region on the first surface of the wiring board 2 except the connection pads 3, and on the region of the second surface except the first land portions 4. External terminals 5 each consisting of a solder ball is formed on the respective first land portions 4. The external terminals 5 are formed on the second surface of the wiring board 2 at predetermined intervals in a lattice pattern.

A semiconductor chip 6 is mounted at a substantially central position of the first surface of the wiring board 2. The semiconductor chip 6 has a logic circuit such as a microprocessor, or a memory circuit such as a SRAM (Static Random Access Memory) or a DRAM (Dynamic Random Access Memory) formed on one surface thereof. A plurality of electrode pads (not shown) are formed near the periphery of the semiconductor chip 6, and a passivation film (not shown) is formed on the region of the one surface of the semiconductor chip 6 except the electrode pads to protect the surface where the circuit is formed. The semiconductor chip 6 is fixed to the wiring board 2 by means of an insulating adhesive material (not shown). Each of the electrode pads (not shown) of the semiconductor chip 6 is electrically connected to the connection pad 3a on the wiring board 2 corresponding thereto, by connecting a conductive wire 7a therebetween.

The connection pad 3b on the first surface of the wiring board 2 is provided with a conductive wire 7b extended upward from the connection pad 3b. A dummy board (dummy chip) 8 made of silicon or the like, the same material as the one used to form the wire 7b, is mounted on the one surface of the semiconductor chip 6 by means of an insulating adhesive material. A conductive wire 7c, which was an end of the wire 7b in a manufacturing process, is connected to the dummy board 8.

The first surface of the wiring board 2, the semiconductor chip 6 and the wires 7a, 7b are sealed with a substantially square-shaped sealing body 9. The distal ends of the wires 7b and wire 7c are exposed from the top of the sealing body 9. A plurality of second land portions 10 are formed in a lattice pattern on the top surface of the sealing body 9, and each of the second land portions 10 is electrically connected to the exposed distal end of the wire 7b by means of a rewiring line 11. The interval between the second land portions 10 may be determined as required according to external terminals or a package size of a semiconductor device to be stacked and mounted on the semiconductor device 1. Further, the heat dissipation can be improved by the configuration in which the dummy board 8 is mounted on the semiconductor chip and the ends of the wires 7c are exposed from the top of the dummy board 8.

FIG. 2 is a cross-sectional view showing an example of a stacked structure using the semiconductor device 1 according to the first embodiment of the present invention.

Figure 2A:
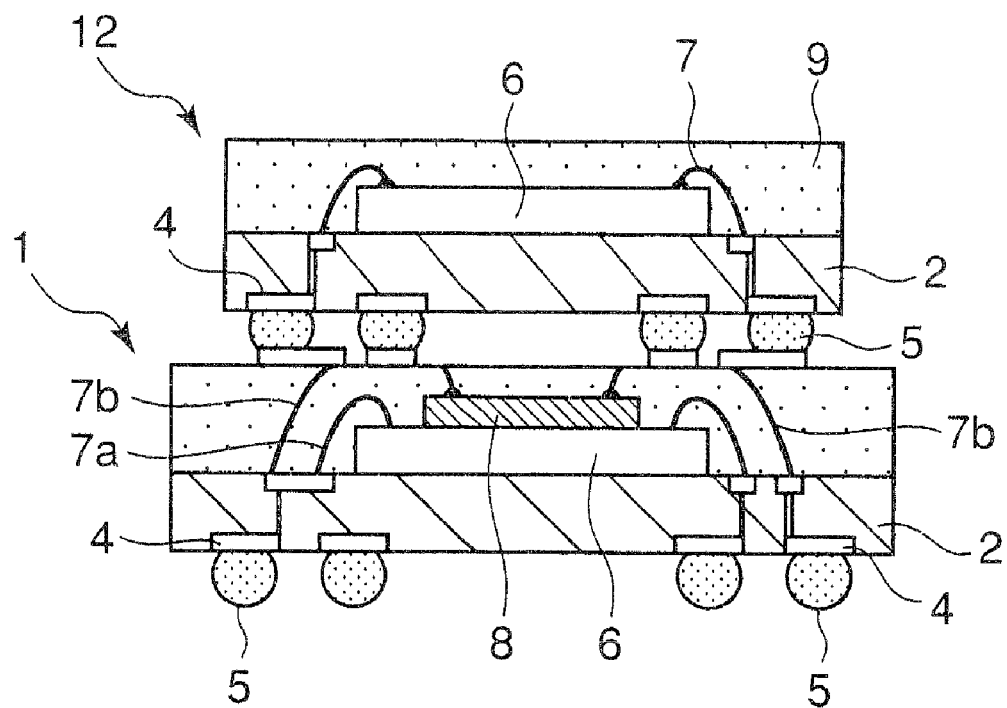
FIG. 2A is a cross-sectional view showing an example of a stacked structure using the semiconductor device according to the first embodiment of the present invention, in which a BGA (Ball Grid Array) type semiconductor device having a fan-in arrangement is stacked and mounted on top of the semiconductor device according to the first embodiment.

FIG. 2A is a diagram showing a case in which a BGA (Ball Grid Array) type semiconductor device 12 having a fan-in arrangement is stacked and mounted on top of the semiconductor device 1 of the first embodiment.

The semiconductor device 12 stacked on top of the semiconductor device 1 has a wiring board 2. A plurality of connection pads are provided near the periphery of a first surface of the wiring board 2, and a plurality of land portions 4 are provided on a second surface of the wiring board 2. Each of the connection pads is electrically connected to the land portion 4 corresponding thereto by means of predetermined wiring. A semiconductor chip 6 is mounted at a substantially central position on the first surface of the wiring board 2. Each of electrode pads of the semiconductor chip 6 is electrically connected to the connection pad of the wiring board 2 corresponding thereto by connecting a conductive wire 7 therebetween. The first surface of the wiring board 2, the semiconductor chip 6 and the wires 7 are sealed with a sealing body 9.

The BGA type semiconductor device 12 having the fan-in arrangement as described above can be mounted on the semiconductor device 1, since the wires 7b are extended upward from the first surface of the wiring board 2 of the semiconductor device 1 such that the distal ends thereof are exposed from the top surface of the sealing portion 9 and the rewiring lines 11 are formed from the exposed ends of the wires 7b.

Figure 2B:
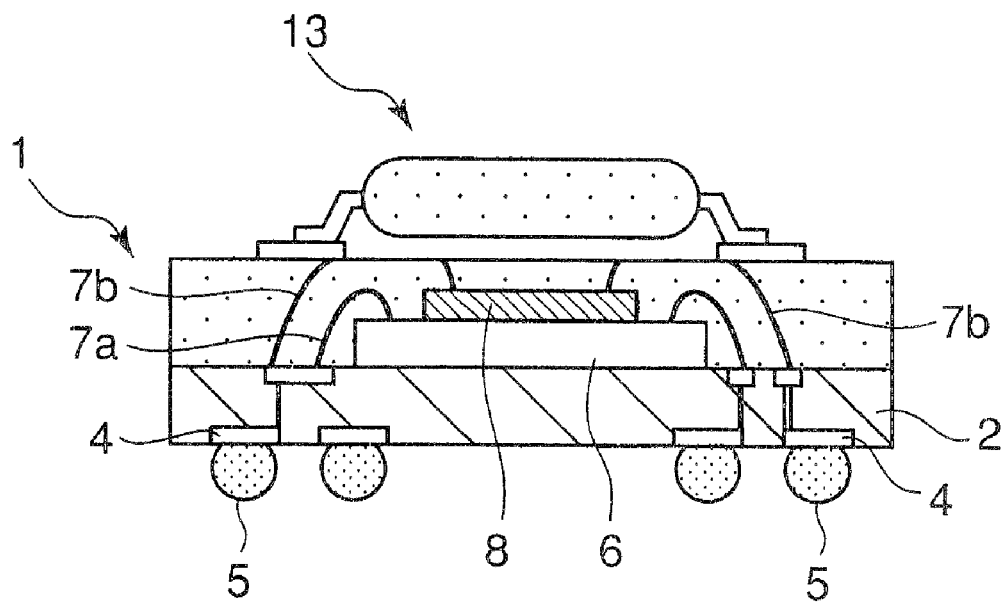
FIG. 2B is a cross-sectional view showing an example of a stacked structure using the semiconductor device according to the first embodiment of the present invention, in which a SOP (Small Outline Package) type semiconductor device is stacked and mounted on top of the semiconductor device of the first embodiment.

FIG. 2B shows a case in which a SOP (Small Outline Package) type semiconductor device 13 is stacked and mounted on top of the semiconductor device 1 of the first embodiment.

The configuration as described above improves the degree of freedom in designing the external terminal arrangement and the package structure of the semiconductor device 12 or 13 stacked on top of the semiconductor device 1. Further, the top surface of the package is polished to expose the ends of the wires 7b, 7c, whereby the top surface of the sealing body 9 is flattened and thus the semiconductor device 12 or 13 can be mounted thereon in a favorable manner.

As described above, the semiconductor device 1 is designed to have the wiring board 2 having the plurality of connection pads 3 formed on the first surface thereof, and the plurality of first land portions 4 formed on the second face thereof and electrically connected to the connection pads 3, the semiconductor chip 6 mounted on the first surface of the wiring board 2, the first conductive members (wires 7a) for electrically connecting between the connection pads 3a of the wiring board 2 and the semiconductor chip 6, the sealing portion 9 for covering at least the first surface of the wiring board 2, the semiconductor chip 6 and the first conductive members (wires 7a), the second conductive members (wires 7b) extended upward from the connection pads 3b of the wiring board 2 and exposed from the sealing portion 9 at the one ends thereof, and the second land portions 10 arranged on the top surface of the sealing portion 9 and electrically connected to the second conductive members (wires 7b), whereby the degree of freedom can be improved in designing the external terminal arrangement and the package structure of the semiconductor device 12 or 13 stacked on top of the semiconductor 1.

Further, the semiconductor device 1 according to the first embodiment, which improves the degree of freedom in designing the external terminal arrangement and the package structure, makes it possible to stack an existing semiconductor device having external terminals arranged in a conventional manner on top thereof, eliminating the need of newly designing a semiconductor device to be stacked thereon. This contributes the cost reduction of the PoP (Package on Package) type semiconductor devices.

Further, the elimination of the need of stacking a semiconductor device having a fan-out pattern arrangement eliminates the need of arranging land portions for stacking an upper semiconductor device in the periphery of the wiring board. This enables size reduction of the semiconductor device. This also eliminates the need of forming the external terminals of the upper semiconductor device higher than the sealing body.

A manufacturing method of the semiconductor device 1 according to the first embodiment will be described with reference to FIG. 3 to FIG. 9.

Figure 3A:
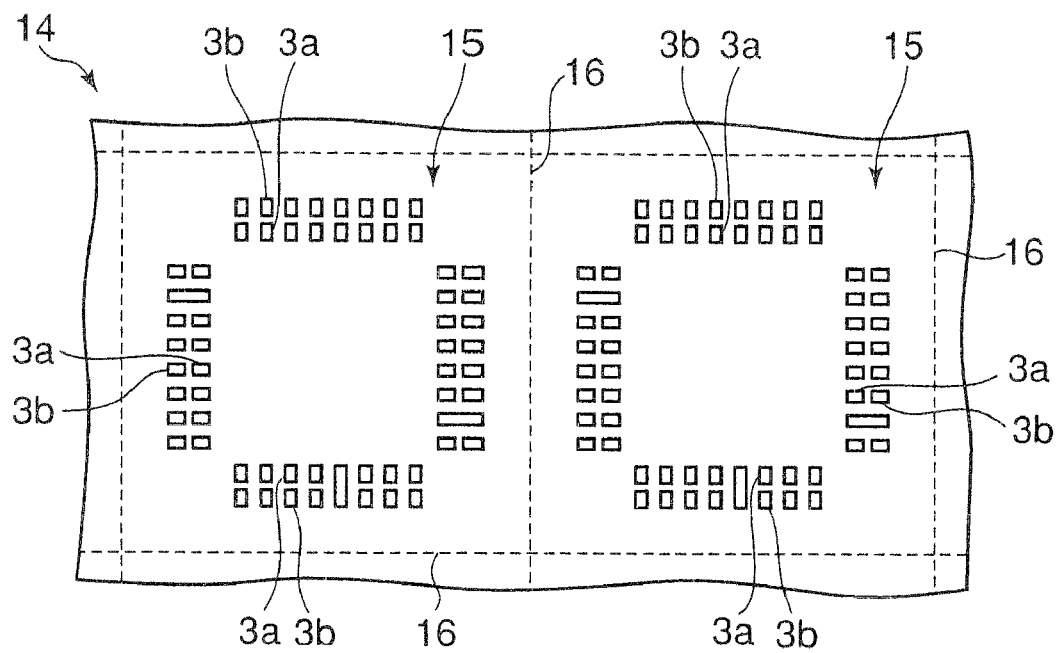
FIG. 3A is a plan view for explaining a manufacturing method of the semiconductor device of the first embodiment, showing a schematic configuration of a wiring board used for manufacturing the semiconductor device of the first embodiment.
Figure 3B:
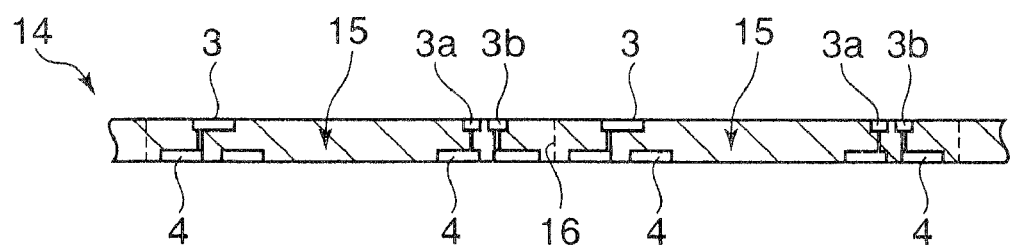
FIG. 3B is a cross-sectional view for explaining the manufacturing method of the semiconductor device of the first embodiment, showing the schematic configuration of the wiring board used for manufacturing the semiconductor device of the first embodiment.

In the first step, as shown in FIGS. 3A and 3B, a wiring mother board 14 formed of the wiring board 2 is prepared. The wiring mother board 14 has a plurality of product formation regions 15 arranged in matrix. Dicing lines 16 are defined by the boundaries between the product formation regions 15. Each of the product formation regions 15 is formed of a glass epoxy board and has a predetermined wiring pattern formed on a first surface and a second surface thereof.

The wiring mother board 14 has a plurality of connection pads 3 provided near the periphery on its first surface, and a plurality of first land portions 4 provided on its second surface. Each of the connection pads 3 and the land portion 4 corresponding thereto are electrically connected to each other by means of predetermined wiring. An insulating film (not shown) of a solder resist, for example, is formed on the first surface of the wiring mother board 14 except the region on the connection pads 3, and on the second surface thereof except the region on the first land portions 4. A frame portion (not shown) is provided around the wiring mother board 14 to position the wiring mother board 14 during transfer thereof.

The wiring mother board 14 is then transferred to a die bonding process, in which a semiconductor chip 6 having a predetermined circuit formed on one surface thereof is mounted at a substantially central position of each of the product formation regions 15 of the wiring mother board 14 (see FIG. 4). Each of the semiconductor chips 6 has an insulating adhesive material on the other surface thereof so that it is adhesively fixed to the product formation region 15 of the wiring mother board 14. A dummy board (dummy chip) 8 is adhesively fixed to the top of the semiconductor chip 6 by means of an insulating adhesive material. The dummy board 8 may be a board having a smaller size than that of the semiconductor chip 6 and made of silicon or the like. The dummy board 8 is mounted at a position on the semiconductor chip 6, avoiding the electrode pads.

Figure 4A:
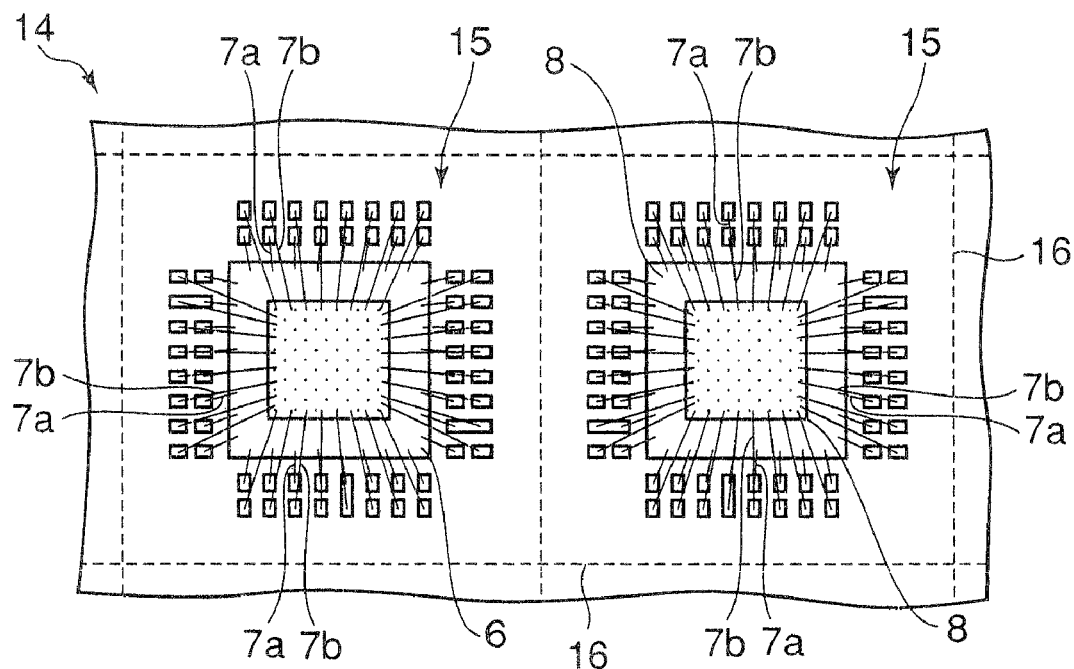
FIG. 4A is a plan view for explaining the manufacturing method of the semiconductor device of the first embodiment, showing the schematic configuration of a wiring mother board after wire bonding.
Figure 4B:
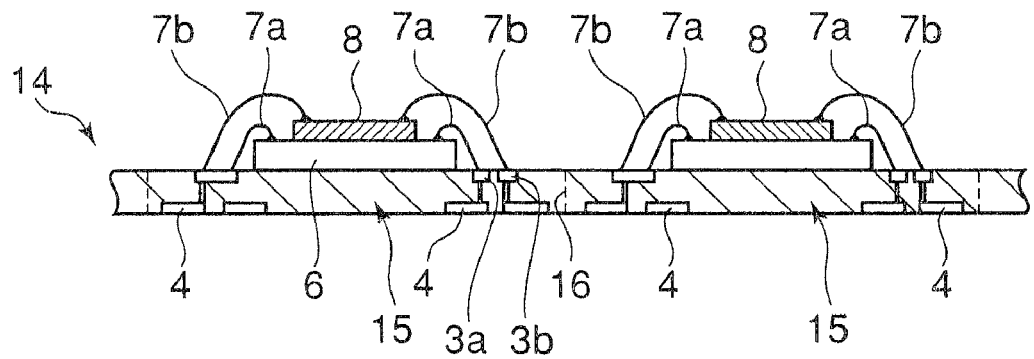
FIG. 4B is a cross-sectional view for explaining the manufacturing method of the semiconductor device of the first embodiment, showing the schematic configuration of the wiring mother board after wire bonding.

The wiring mother board 14 having the semiconductor chips 6 and the dummy boards 8 mounted thereon is then transferred to a wire bonding process. As shown in FIGS. 4A and 4B, the electrode pads of the semiconductor chips 6 and the connection pads 3a of the product formation regions 15 are electrically connected to each other by connecting a conductive wire 7a therebetween. Further, the dummy boards 8 are electrically connected to the connection pads 3b of the product formation regions 15 by connecting a conductive wire 7b therebetween. The wires 7a and 7b are made of a conductive material such as Au.

Figure 5A:
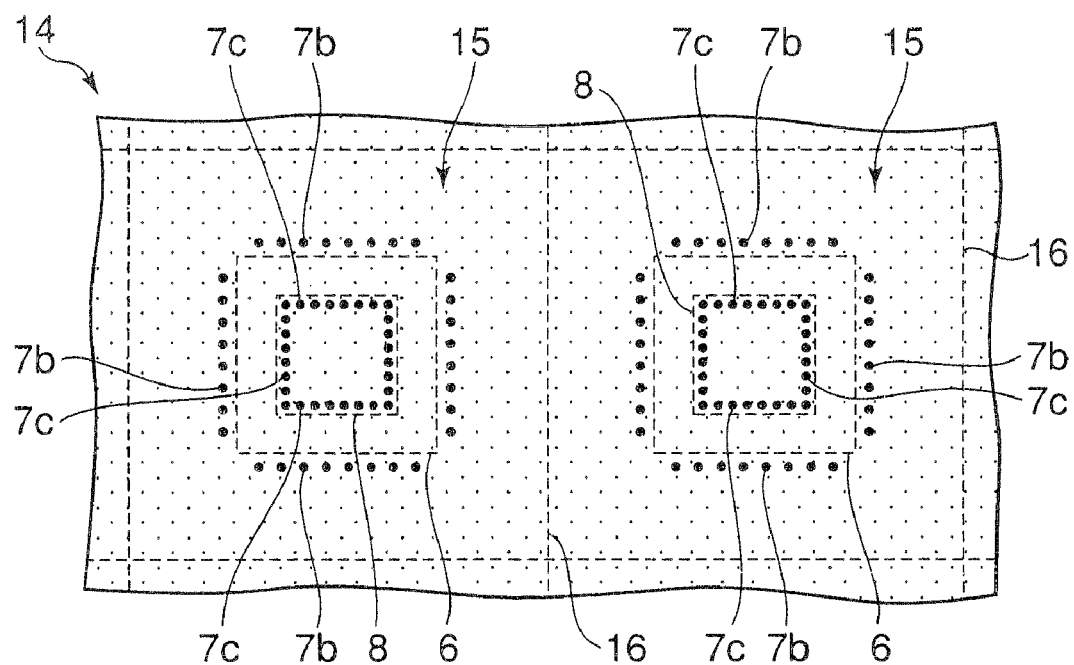
FIG. 5A is a plan view for explaining the manufacturing method of the semiconductor device of the first embodiment, showing the schematic configuration of the wiring mother board after a polishing process.
Figure 5B:
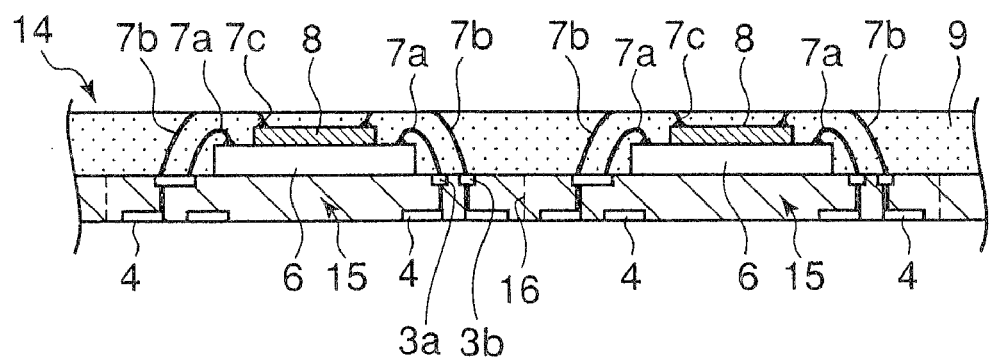
FIG. 5B is a cross-sectional view for explaining the manufacturing method of the semiconductor device of the first embodiment, showing the schematic configuration of the wiring mother board after the polishing process.

As shown in FIGS. 5A and 5B, the wiring mother board 14 after the wire bonding is transferred to a molding process, in which the product formation regions 15 of the wiring mother board 14 are collectively molded, whereby a sealing body 9 is formed to cover the first surfaces of the product formation regions 15, the semiconductor chips 6, the dummy boards 8 and the wires 7a, 7b. The sealing body 9 is formed of an insulating resin such as an epoxy resin. The sealing body 9 is formed by a transfer mold device (not shown), for example.

The wiring mother board 14 is thus formed with the sealing body 9 collectively covering the plurality of product formation regions 15, and the sealing body 9 is polished such that the sealing body 9 is polished down to a predetermined thickness, for example to such an extent that the wires 7b connecting between the dummy boards 8 and the connection pads 3b of the wiring mother board 14 are separated. This means that the wires 7b connecting between the dummy boards 8 and the connection pads 3b of the wiring mother board 14 are also polished off. As a result, as shown in FIGS. 5A and 5B, the wires are separated into the wires 7b extended upward from the connection pads 3b of the wiring mother board 14 and the wires 7c extended upward from the dummy board 8, and the distal ends of the wires 7b and 7c are exposed from the top surface of the sealing body 9. These wires 7b provide interconnection from the wiring mother board 14 to the upside of the sealing body 9.

Figure 6:
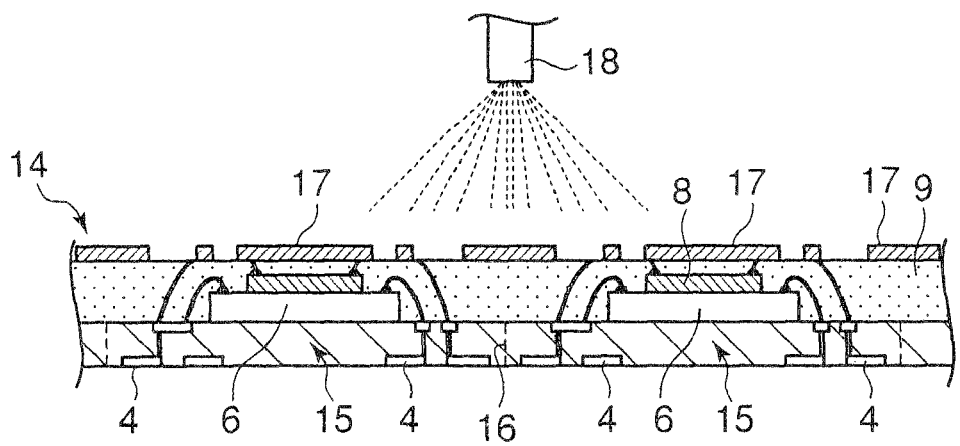
FIG. 6 is a diagram for explaining the manufacturing method of the semiconductor device of the first embodiment, showing a formation process of rewiring lines.
Figure 7A:
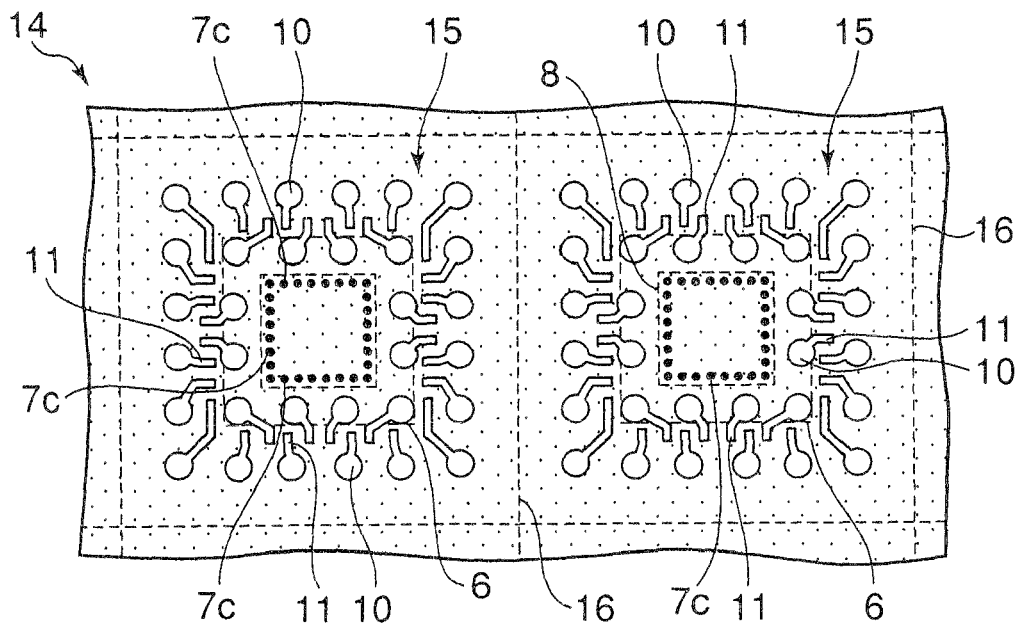
FIG. 7A is a plan view for explaining the manufacturing method of the semiconductor device of the first embodiment, showing a schematic configuration of the wiring mother board after the formation of the rewiring lines.
Figure 7B:
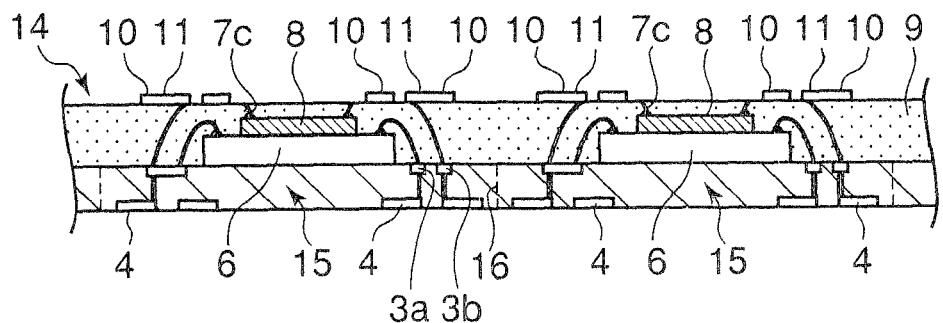
FIG. 7B is a cross-sectional view for explaining the manufacturing method of the semiconductor device of the first embodiment, showing the schematic configuration of the wiring mother board after the formation of the rewiring lines.

Subsequently, rewiring lines 11 are formed on the top of the sealing body 9 of the wiring mother board 14. As shown in FIG. 6, for example, the rewiring lines 11 are formed by uniformly applying ink containing particles of a metal such as Cu with the use of an ink jet nozzle 18 in the state in which a mask 17 is held and fixed to the top of the sealing portion 9. This forms the second land portions 10 as well as the wiring lines 11 on the top of the sealing portion 9 as shown in FIGS. 7A and 7B such that the wiring lines 11 electrically connect the second land portions 10 and the wires 7b exposed above the sealing portion 9. Since the top of the sealing portion 9 is polished uniformly as described above, the rewiring lines 11 can be formed accurately.

Figure 8:
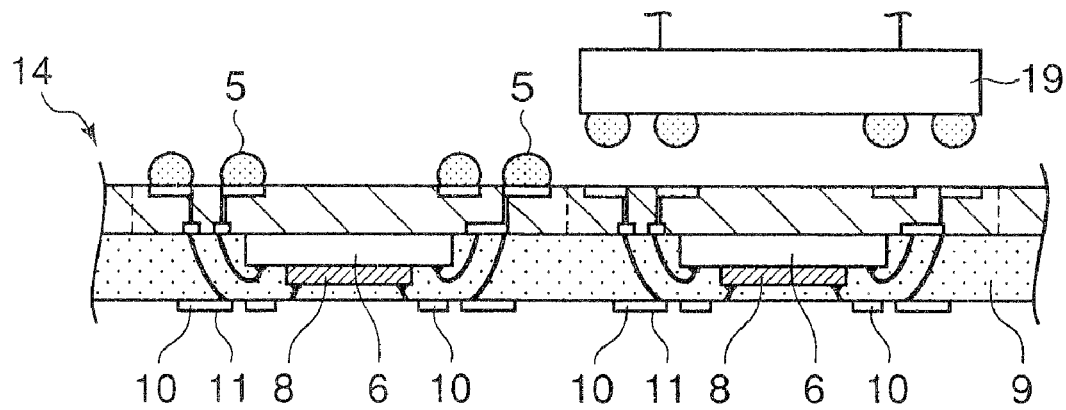
FIG. 8 is a diagram for explaining the manufacturing method of the semiconductor device of the first embodiment, showing a ball mounting process.

After the formation of the rewiring lines 11, as shown in FIG. 8, external terminals 5 are formed on the first land portions 4 provided on the second surface of the product formation regions 15 of the wiring mother board 14. The formation of the external terminals 5 are performed with the use of a mounting tool 19 of a ball mounting device, for example, by which balls of solder or the like are held by vacuum suction, mounted on the first land portions 4 with flux interposed therebetween, and reflowed.

Figure 9:
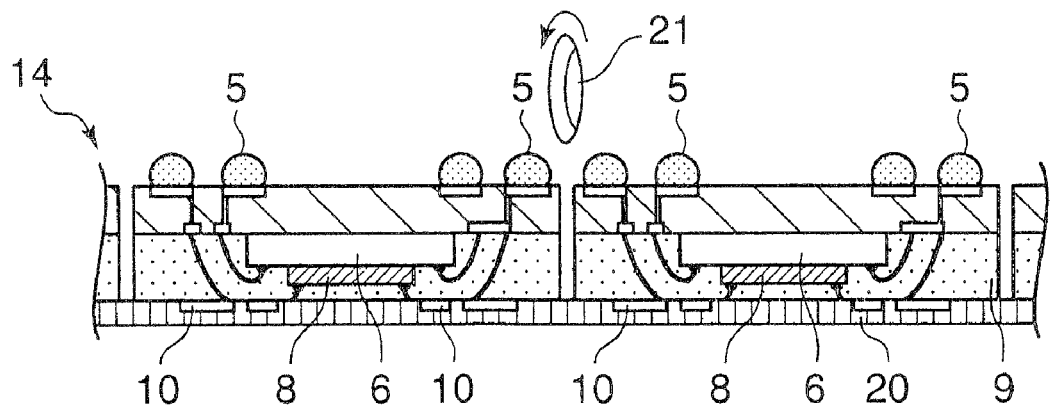
FIG. 9 is a diagram for explaining the manufacturing method of the semiconductor device of the first embodiment, showing a board dicing process.

The wiring mother board 14 having the external terminals 5 formed thereon is then separated into the product formation regions 15 by cutting off along the dicing lines 16. As shown in FIG. 9, the sealing body 9 is affixed to a dicing tape 20 and the wiring mother board 14 is cut and separated into the product formation regions 15 along the dicing lines 16 with the use of a dicing blade 21 which rotates rapidly. Thus, the semiconductor device 1 as shown in FIG. 1 is obtained.

As described above, the semiconductor device 1 can be obtained by the method in which the semiconductor chip 6 is mounted on the first surface of the wiring board 2, the dummy board 8 is mounted on the semiconductor chip 6, the wiring board 2 and the semiconductor chip 6, and the wiring board 2 and the dummy board 8 are connected by means of the conductive wires 7a and 7b, respectively, the sealing body 9 is formed to cover the first surface of the wiring board 2, the semiconductor chip 6, the dummy board 8, and the wires 7a and 7b, and the wiring lines extended upward from the wiring board 2 to the upside of the sealing body 9 can be formed by polishing the sealing body 9 until the wires 7b connecting between the wiring board 2 and the dummy board 8 are separated off. Further, the formation of the rewiring lines 11 on the top of the sealing body 9 makes it possible to stack another semiconductor device in a favorable manner regardless of the shape or the like of the external terminals thereof. Further, the polished sealing body 9 has its top surface flattened uniformly, and hence the second land portions 10 formed thereon are also flattened. This makes it possible to stack another semiconductor device with high accuracy.

According to the first embodiment of the present invention as described above, the degree of freedom can be improved in designing the external terminal arrangement and the package structure of a semiconductor device to be stacked on top. Further, the improvement in the degree of freedom in designing the external terminal arrangement and the package structure makes it possible to stack an existing semiconductor device having a conventional external terminal arrangement, and thus eliminates the need of newly designing a semiconductor device to be stacked on top. This contributes to the cost reduction of the PoP type semiconductor device. The eliminated need of stacking a semiconductor device having a fan-out pattern arrangement eliminates the need of arranging land portions for stacking an upper semiconductor device in the periphery of the wiring board. Accordingly, the size of the semiconductor device can be reduced.

Furthermore, the size reduction of the semiconductor device contributes to size reduction of a mounting board to mount the semiconductor device and of an electronic device incorporating the semiconductor device.

Second Embodiment

Figure 10A:
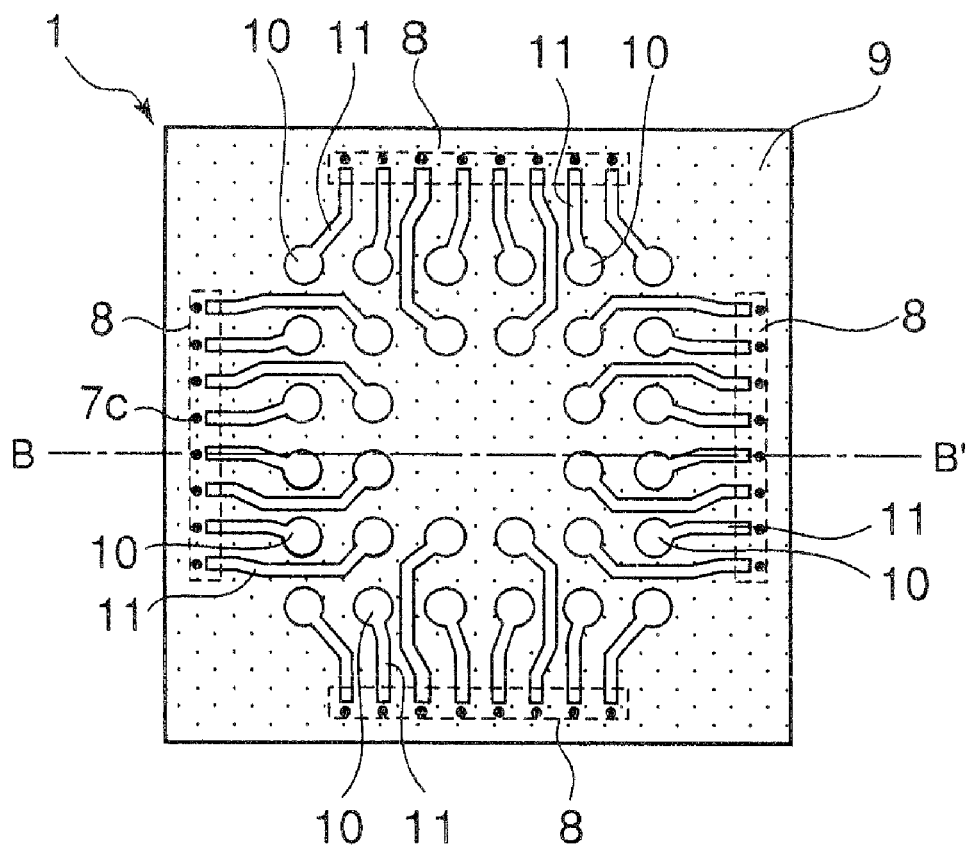
FIG. 10A is a plan view showing a semiconductor device according to a second embodiment of the present invention.
Figure 10B:
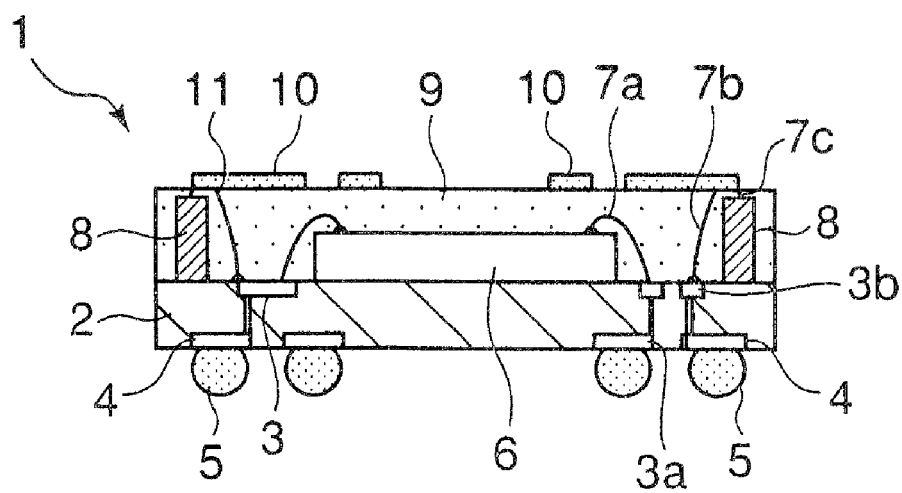
FIG. 10B is a cross-sectional view showing the semiconductor device according to the second embodiment of the present invention.

FIGS. 10A and 10B are diagrams showing a schematic configuration of a semiconductor device according to a second embodiment of the present invention.

Like the first embodiment, the semiconductor device 1 according to the second embodiment has a substantially square plate-shaped wiring board 2. The wiring board 2 is provided with a plurality of connection pads 3 near the periphery of its first surface, and with a plurality of first land portions 4 on its second surface. Each of the connection pads 3 and the first land portion 4 corresponding thereto are electrically connected to each other by means of predetermined wiring. External terminals 5 each formed of a solder ball are formed on the respective first land portions 4.

A semiconductor chip 6 is mounted at a substantially central position on the first surface of the wiring board 2. A plurality of electrode pads (not shown) are formed near the periphery of the first surface of the semiconductor chip 6. The semiconductor chip 6 is fixed to the wiring board 2 by means of an insulating adhesive material (not shown). Each of the electrode pads of the semiconductor chip 6 and the corresponding connection pad 3a of the wiring board 2 are electrically connected to each other by connecting a conductive wire 7a therebetween.

In the semiconductor device according to the second embodiment, as shown in FIGS. 10A and 10B, four dummy boards 8 which are higher at least than the height of the semiconductor chip 6 are mounted in peripheral portions of the wiring board 2. The dummy boards 8 are made of silicon or the like and are mounted along the periphery of the wiring board 2 by means of an insulating adhesive material. Conductive wires 7c are connected to the dummy boards 8. The dummy boards 8 which are higher than the semiconductor chip 6 are arranged in the vicinity of the connection pads 3, whereby wire deformation is prevented and the wires 3 can be formed in a favorable manner.

The first surface of the wiring board 2, the semiconductor chip 6, and the wires 7a and 7b are sealed with a substantially square-shaped sealing body 9. The distal ends of the wires 7b and wire 7c are exposed from the top of the sealing body 9. A plurality of second land portions 10 are formed in a lattice pattern on the top surface of the sealing portion 9, and are electrically connected to the exposed distal ends of the wires 7b by means of rewiring lines 11. The arrangement of the dummy boards 8 to be higher than the semiconductor chip 6 and in the vicinity of the connection pads 3 prevents wire deformation and enables the wires 7b to be formed favorably. Thus, the wires 7b can be exposed to the upside of the sealing portion 9 with high accuracy.

Figure 11:
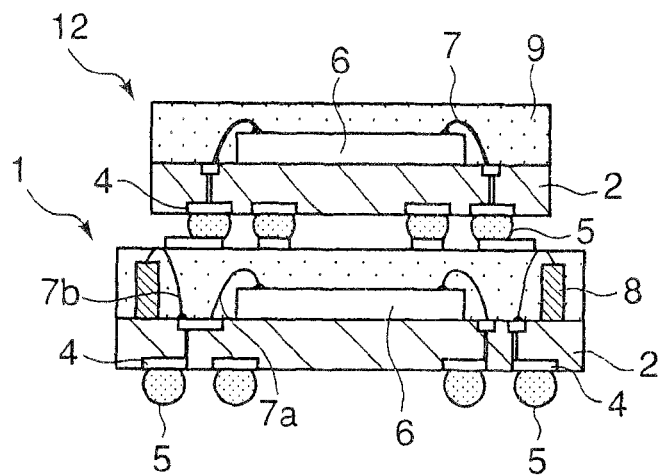
FIG. 11 is a cross-sectional view showing an example of a stacked structure of the semiconductor device of the second embodiment.

FIG. 11 is a cross-sectional view showing an example of a stacked structure of the semiconductor device 1 according to the second embodiment.

Like the first embodiment as shown in FIG. 11, the wires 7b are extended upward from the first surface of the wiring board 2 such that the distal ends thereof are exposed from the top surface of the sealing portion 9 and the rewiring lines 11 are formed from the exposed wires 7b, whereby the degree of freedom can be improved in designing the arrangement of the external terminals 5 and the package structure of the semiconductor device 12. Further, since the top surface of the package is polished to expose the wires 7b, the top surface of the sealing body 9 is flattened, enabling the semiconductor device 12 to be stacked on top in a favorable manner.

The semiconductor device 12 stacked on top of the semiconductor device 1 also has a wiring board 2. The wiring board 2 has a plurality of connection pads formed near the periphery of its first surface, and a plurality of land portions 4 formed on its second surface. Each of the connection pads is electrically connected to the land portion 4 corresponding thereto by means of predetermined wiring. A semiconductor chip 6 is mounted on a substantially central position on the first surface of the wiring board 2. Each of the electrode pads of the semiconductor chip 6 and the connection pad of the wiring board 2 corresponding thereto are electrically connected to each other by connecting a conductive wire 7 between them. The first surface of the wiring board 2, the semiconductor chip 6, and the wires 7 are sealed with a sealing body 9.

Figure 12A:
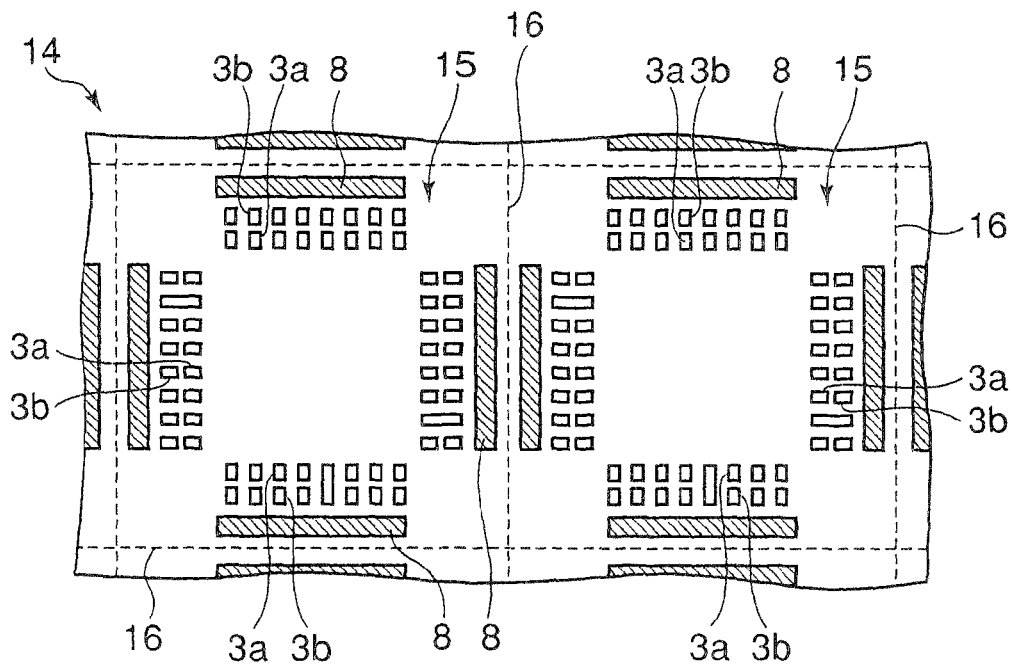
FIG. 12A is a plan view for explaining a manufacturing method of the semiconductor device of the second embodiment, showing a schematic configuration of a wiring board used for manufacturing the semiconductor device.
Figure 12B:
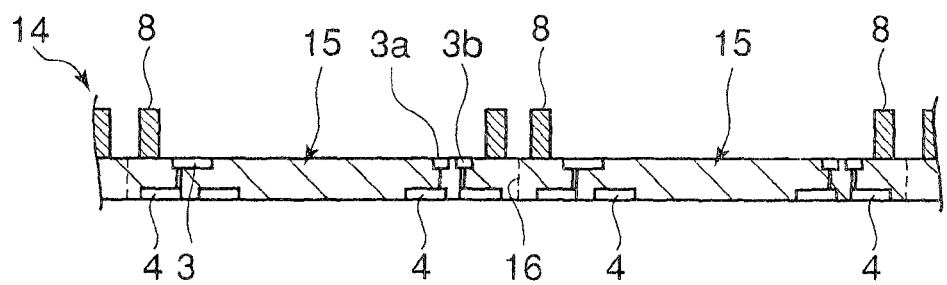
FIG. 12B is a cross-sectional view for explaining the manufacturing method of the semiconductor device of the second embodiment, showing the schematic configuration of the wiring board used for manufacturing the semiconductor device.
Figure 13A:
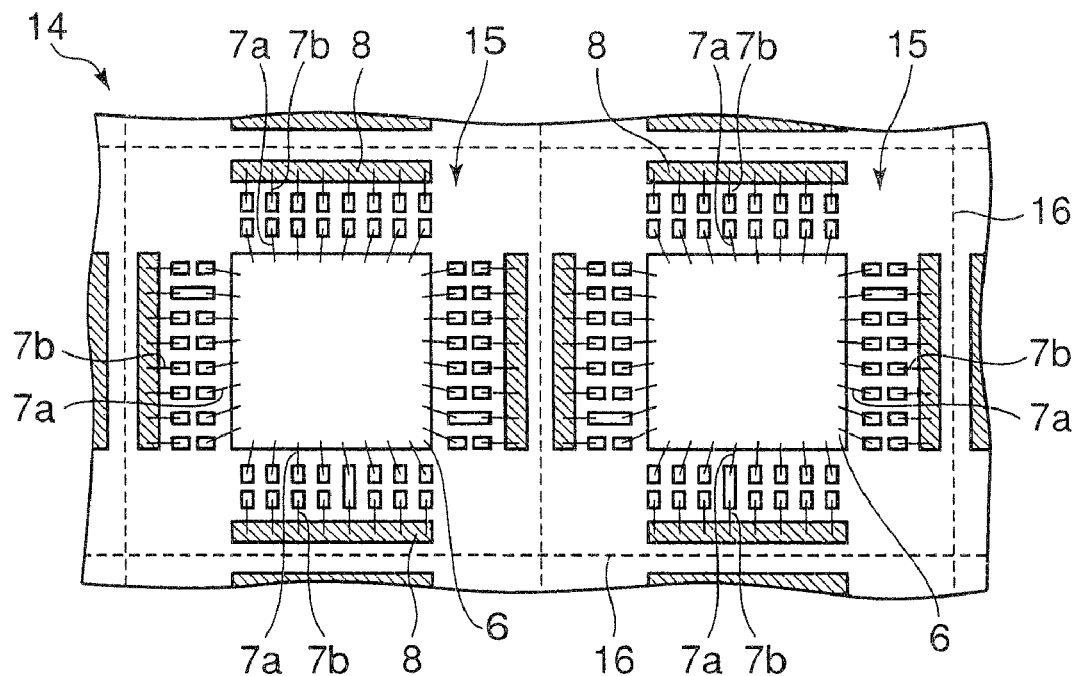
FIG. 13A is a plan view for explaining the manufacturing method of the semiconductor device of the second embodiment, showing a schematic configuration of a wiring mother board after wire bonding.
Figure 13B:
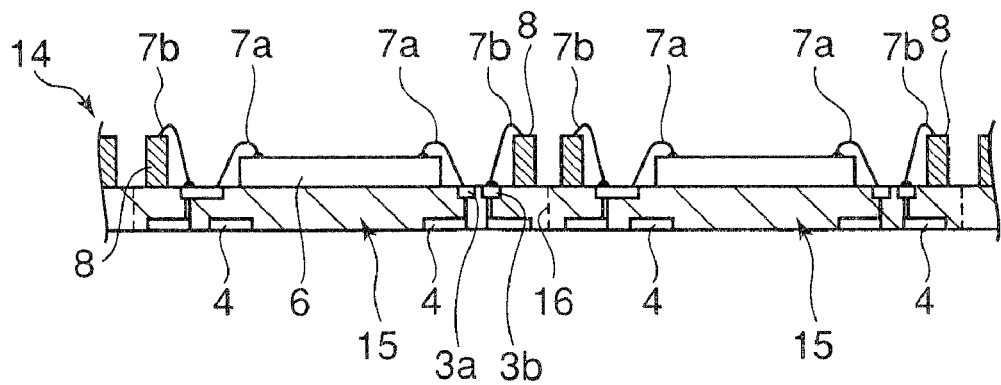
FIG. 13B is a cross-sectional view for explaining the manufacturing method of the semiconductor device of the second embodiment, showing the schematic configuration of the wiring mother board after wire bonding.
Figure 14A:
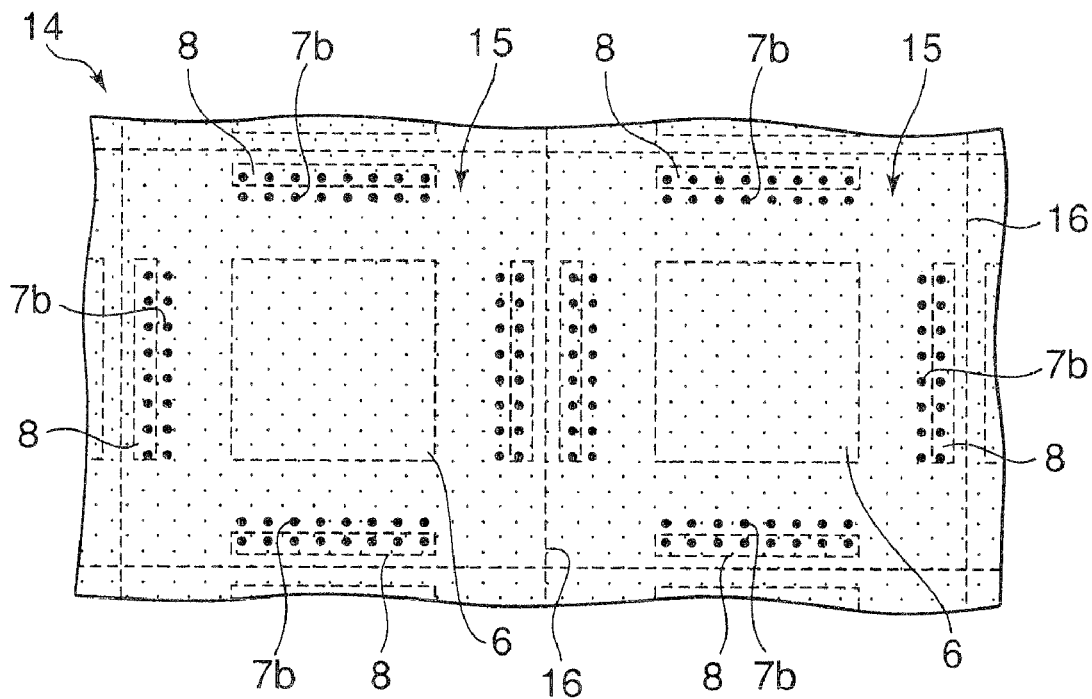
FIG. 14A is a plan view for explaining the manufacturing method of the semiconductor device of the second embodiment, showing a schematic configuration of the wiring mother board after a polishing process.
Figure 14B:
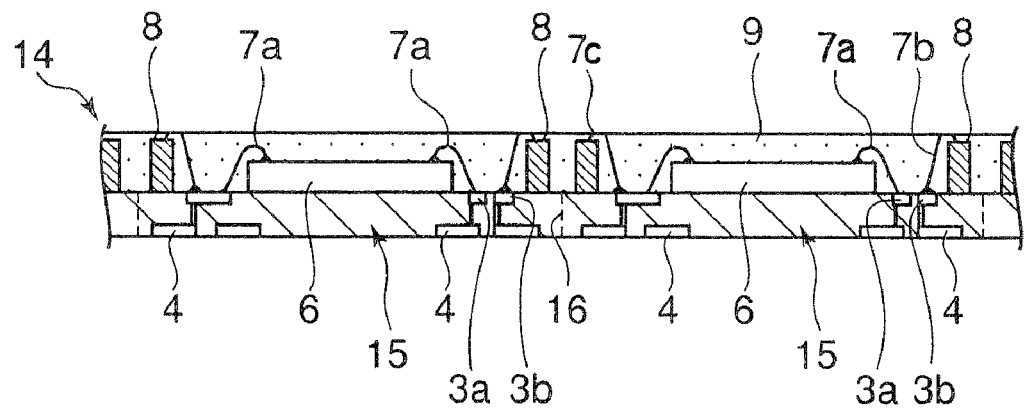
FIG. 14B is a cross-sectional view for explaining the manufacturing method of the semiconductor device of the second embodiment, showing the schematic configuration of the wiring mother board after the polishing process.
Figure 15A:
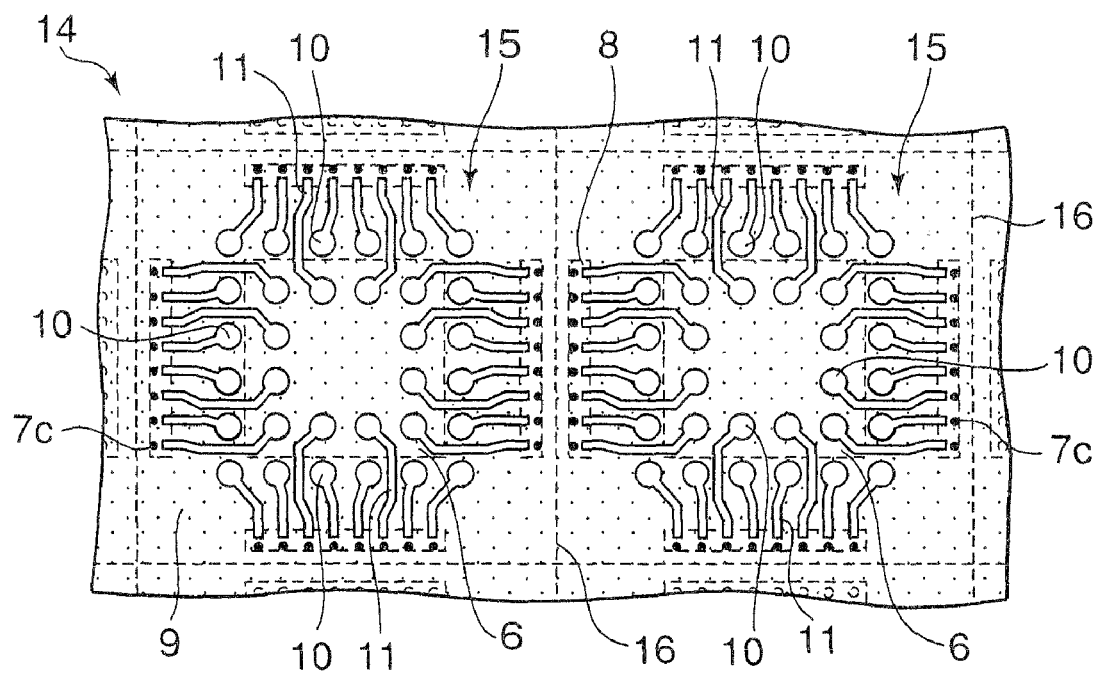
FIG. 15A is a plan view for explaining the manufacturing method of the semiconductor device of the second embodiment, showing a schematic configuration of the wiring mother board after formation of rewiring lines.
Figure 15B:
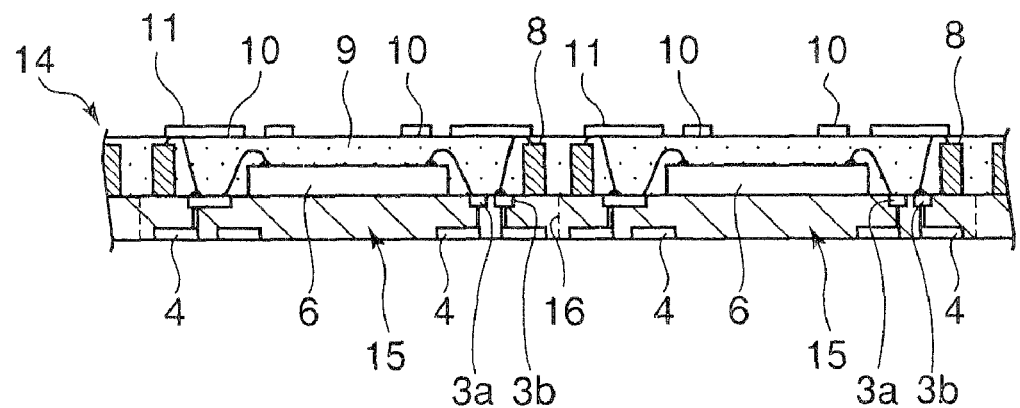
FIG. 15B is a cross-sectional view for explaining the manufacturing method of the semiconductor device of the second embodiment, showing the schematic configuration of the wiring mother board after formation of rewiring lines.

A manufacturing method of the semiconductor device according to the second embodiment will be described with reference to FIGS. 12 to 15. FIGS. 12A and 12B are diagrams showing a schematic configuration of a wiring board used for manufacturing the semiconductor device according to the second embodiment. FIGS. 13A and 13B are diagrams showing a schematic configuration of a wiring mother board after wire bonding. FIGS. 14A and 14B are diagrams showing a schematic configuration of the wiring mother board after polishing process. FIGS. 15A and 15B are diagrams showing a schematic configuration of the wiring mother board after formation of rewiring lines.

In the first step, as shown in FIGS. 12A and 12B, a wiring mother board 14 formed of the wiring board 2 is prepared. Like the first embodiment, the wiring mother board 14 has a plurality of product formation regions 15 arranged in matrix. Dicing lines 16 are defined by the boundaries between the product formation regions 15. Each of the product formation regions 15 has a predetermined wiring pattern formed on a first surface and a second surface thereof. The wiring mother board 2 has a plurality of connection pads 3 formed near the periphery on the first surface, and a plurality of first land portions 4 formed on the second surface of the wiring mother board 2. Each of the connection pads 3 and the land portion 4 corresponding thereto are electrically connected to each other by means of predetermined wiring. Dummy boards 8 are mounted in the peripheral parts, for example along the four edges of the product formation regions 15. The dummy boards 8 are formed to be thicker at least than the thickness of a semiconductor chip 6 to be mounted.

A semiconductor chip 6 having a predetermined circuit formed on a first surface thereof is mounted in a substantially central part of each of the product formation regions 15 of the wiring mother board 14 by means of an insulating adhesive material (see FIG. 13). In the wiring mother board 14 having the semiconductor chips 6 and the dummy boards 8 mounted thereon, as shown in FIGS. 13A and 13B, each of the electrode pads of the semiconductor chips 6 and the connection pads 3a of the product formation regions 15 are electrically connected to each other by connecting a conductive wire 7a therebetween.

Further, the dummy boards 8 are connected to the connection pads 3b of the product formation regions 15 by connecting a conductive wire 7b therebetween.

Subsequently, as shown in FIGS. 14A and 14B, a sealing body 9 is formed to collectively cover the first surface of the product formation regions 15, the semiconductor chips 6, the dummy boards 8, and the wires 7a and 7b. The wiring mother board 14 having the sealing body 9 formed to collectively cover the plurality of product formation regions 15 is polished down to such an extent that the wires 7b connecting between the dummy boards 8 and the connection pads 3b of the wiring mother board 14 are separated. This means that the wires 7b connecting between the dummy boards 8 and the connection pads 3b of the wiring mother board 14 are also polished off.

As a result, as shown in FIGS. 14 and 14B, the wires are separated into the wires 7b extended upward from the connection pads 3b of the wiring mother board 14 and the wires 7c extended upward from the dummy board 8, and the distal ends of the wires 7b and 7c are exposed from the top surface of the sealing body 9. These wires 7b provide interconnection from the wiring mother board 14 to the upside of the sealing body 9. Further, the formation of the dummy boards 8 to be higher than the semiconductor chips 6 and to be in the vicinity of the connection pads 3 prevents wire deformation and enables favorable formation of the wires 7, and thus the wires 7b can be exposed to the upside of the sealing portion 9 with high accuracy.

Subsequently, like the first embodiment, the wiring mother board 14 is provided, as shown in FIGS. 15A and 15, with second land portions 10 formed on the top of the sealing portion 9 and with rewiring lines 11 for electrically connecting the second land portions 10 and the wires 7b exposed to the upside of the sealing portion 9. After the formation of the rewiring lines 11, like the first embodiment, external terminals 5 are formed on the first land portions 4 formed on the second surface of the product formation regions 15 of the wiring mother board 14, and the wiring mother board 14 is cut and separated into the product formation regions 15 so that semiconductor devices 1 as shown in FIG. 10 are obtained.

Third Embodiment

FIG. 16 is a diagram showing a schematic configuration of a semiconductor device according to a third embodiment of the present invention.

The semiconductor device 1 according to the third embodiment has a substantially square plate-shaped wiring board 2, like the first embodiment. The wiring board 2 has a plurality of connection pads 3 formed near the periphery on its first surface, and a plurality of first land portions 4 formed on its second surface. Each of the connection pads 3 and the first land portion 4 corresponding thereto are electrically connected to each other by means of predetermined wiring. An external terminal 5 formed of a solder ball is formed each of the first land portions 4.

A semiconductor chip 6 is mounted at a substantially central position on the first surface of the wiring board 2. A plurality of electrode pads (not shown) are formed near the periphery of the semiconductor chip 6. The semiconductor chip 6 is fixed to the wiring board 2 by means of an insulating adhesive material (not shown). The electrode pads of the semiconductor chip 6 are electrically connected to the corresponding connection pads 3b of the wiring board 2, respectively, by connecting a conductive wire 7a therebetween.

Figure 16A:
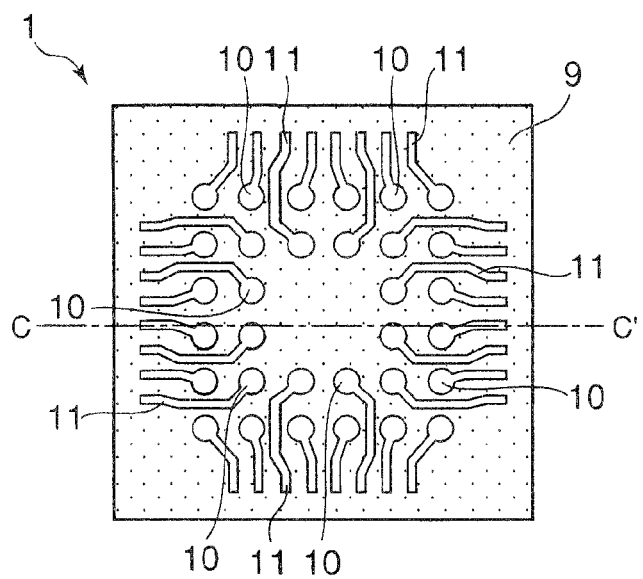
FIG. 16A is a plan view showing a semiconductor device according to third embodiment of the present invention.
Figure 16B:
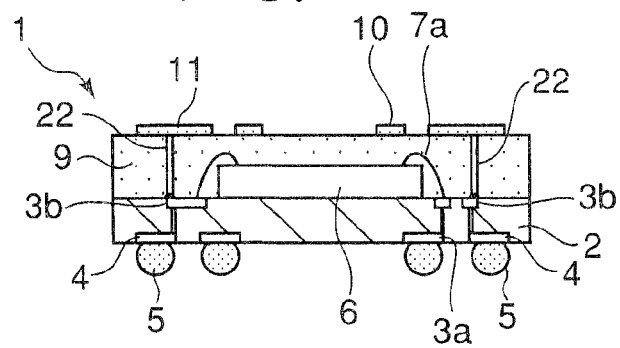
FIG. 16B is a cross-sectional view showing the semiconductor device according to the third embodiment of the present invention.
Figure 16C:
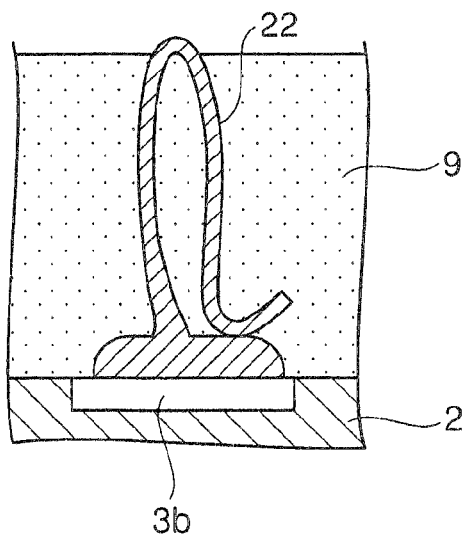
FIG. 16C is a cross-sectional view of a principal part of the semiconductor device according to the third embodiment of the present invention.

In the semiconductor device according to the third embodiment, as shown in FIGS. 16A, 16B and 16C, a wire bump 22 is formed at least on each of the connection pads 3b of the wiring board 2. The wire bumps 22 are formed to be higher than the semiconductor chip 6. The wire bumps 22 are each joined to the connection pad 3b of the wiring board 2 by forming a ball by melting the tip end of a conductive wire, for example, and then joining the ball by ultrasonic thermocompression. The wire is then formed into a predetermined loop such that the distal end is joined by ultrasonic thermocompression to the part that has been joined to the connection pad 3b.

The first surface of the wiring board 2, the semiconductor chip 6, the wires 7a and the wire bumps 22 are sealed with a substantially square-shaped sealing body 9. The tops of the wire bumps 22 are exposed from the top surface of the sealing body 9. A plurality of second land portions 10 are formed in a lattice pattern on the top surface of sealing portion 9, and the second land portions 10 are each electrically connected to the distal ends of the wire bumps 22 by means of rewiring lines 11.

The rewiring lines 11 are formed from the wire bumps 22 which extend upward from the first surface of the wiring board 2 and the tops of which are exposed from the top surface of the sealing portion 9. This improves the degree of freedom in designing the external terminal arrangement and the package structure of a semiconductor device to be stacked on top, like the first embodiment. Further, the top surface of the package is polished to expose the wire bumps, whereby the top surface of the sealing body is flattened. This makes it possible to mount a semiconductor device to be stacked on top in a favorable manner.

According to the third embodiment, the wire bumps 22 provide wiring lines extended upward from the wiring board 2 to the upside of the sealing portion 9. This eliminates the need of dummy boards, resulting in cost reduction. Further, the absence of the dummy boards makes it possible to reduce the size and thickness of the semiconductor device.

The semiconductor device 1 according to the third embodiment is manufactured by a method in which a semiconductor chip 6 is mounted on a first surface of a wiring board 2, the wiring board 2 is connected to a semiconductor chip by means of first conductive members (wires 7a), wire bumps 22 having a predetermined loop shape are formed on the wiring board 2, a sealing body 9 is formed to cover the first surface of the wiring board 2 the semiconductor chip 6, and the wire bumps 22, the wire bumps 22 are extended upward from the wiring board 2 to be exposed above the sealing body 9, rewiring lines 11 are formed on the top of the sealing body 9 to be connected to the exposed wire bumps 22, and second land portions 10 are formed on the top of the sealing body 9 to be connected to the rewiring lines 11.

The present invention is applicable to a wide variety of stacking semiconductor devices designed to form a single package by stacking a plurality of semiconductor devices. For example, the present invention is applicable to a semiconductor device having a configuration in which semiconductor chips are stacked within a sealing body such as SCSP (Stacked Chip Size Package), or a semiconductor device having a configuration in which a plurality of semiconductor chips are mounted within a sealing body such as MCP (Multi Chip Package) or SiP (System In Package).

It is apparent that the present invention is not limited to the above embodiments, but may be modified and changed without departing the scope and sprit of the invention.

What is claimed is:
1. A semiconductor device comprising:
a wiring board including a first surface, a second surface opposite to the first surface, a plurality of connection pads formed on the first surface, and a plurality of first lands formed on the second surface, the first lands being electrically connected to the connection pads, respectively;
a semiconductor chip mounted on the first surface of the wiring board;
a plurality of first conductive members electrically connecting the connection pads of the wiring board to the semiconductor chip;
an insulating resin layer formed on the first surface of the wiring board to cover the semiconductor chip and the first conductive members;
a plurality of second conductive members formed on the connection pads of the wiring board, so as to penetrate through the insulating resin layer; and
a plurality of second lands formed on the insulating resin layer and electrically connected to the second conductive members, respectively;
wherein the plurality of first conductive members include a third conductive member and a fourth conductive member,
wherein the plurality of second conductive members include a fifth conductive member and a sixth conductive member, and
wherein the plurality of connection pads include a first connection pad, a second connection pad and a third connection pad, the first connection pad being connected to both of the third conductive member and the fifth conductive member, the second connection pad being connected to the fourth conductive member without connecting to the first connection pad, and the third connection pad being connected to the sixth conductive member without connecting to the second connection pad.

2. The semiconductor device according to claim 1, further comprising:
a rewiring line formed on the insulating resin layer and electrically connected to the second land to the second conductive member.

3. The semiconductor device according to claim 1, wherein the second connection pad is positioned near the semiconductor chip than the third connection pad.

4. The semiconductor device according to claim 1, further comprising:
a silicon board stacked on the semiconductor chip to form the second conductive member.

5. The semiconductor device according to claim 4, further comprising:
a seventh conductive member formed on the silicon board, so as to penetrate though the insulating resin layer.

6. The semiconductor device according to claim 1, further comprising:
another semiconductor device is stacked through the second land.

7. A semiconductor device, comprising:
a wiring board having first connection pads formed on a first surface, second connection pads formed on the first surface, and first land portions formed on a second surface and electrically connected to selected ones of the first and second connection pads;
a semiconductor chip mounted on the first surface of the wiring board;
first conductive members electrically connecting the first connection pads of the wiring board with the semiconductor chip;
a sealing portion covering at least the first surface of the wiring board, the semiconductor chip and the first conductive members, the sealing portion including a top surface;
second conductive members extending from the second connection pads of the wiring board and terminating at the top surface of the sealing portion;
rewiring lines arranged on the top surface of the sealing portion to be connected to the second conductive members;
second land portions arranged on the top surface of the sealing portion such that the second land portions are substantially coplanar with the rewiring lines, the second land portions being connected to the rewiring lines so that the second land portions are electrically connected to the second conductive members through the rewiring lines;
a dummy board is provided on the semiconductor chip to form the second conductive members; and
third conductive members provided on the dummy board, each of the third conductive members extended from the dummy board to the top surface of the sealing portion.

8. The semiconductor device according to claim 7, further comprises:
another semiconductor device is stacked through the second land portions.

9. The semiconductor device according to claim 8, further comprises:
an interval between the second land portions is determined according to an external terminal arrangement and a package structure of the another semiconductor device.

* * * * *